United States Patent [19]

Amir et al.

[11] 4,404,525
[45] Sep. 13, 1983

[54] SWITCHED CAPACITOR GAIN STAGE WITH OFFSET AND SWITCH FEEDTHROUGH CANCELLATION SCHEME

[75] Inventors: Gideon Amir; Yusuf Haque, both of San Jose; Roubik Gregorian, Santa Clara, all of Calif.

[73] Assignee: American Microsystems, Inc., Santa Clara, Calif.

[21] Appl. No.: 239,945

[22] Filed: Mar. 3, 1981

[51] Int. Cl.³ .............................................. H03F 1/34
[52] U.S. Cl. ....................................... 330/9; 330/107; 328/167
[58] Field of Search .................... 330/9, 51, 107, 109, 330/149; 328/127, 167; 333/173; 307/520

[56] References Cited

U.S. PATENT DOCUMENTS 4,297,642 10/1981 Baldwin et al. ...................... 330/9

FOREIGN PATENT DOCUMENTS 2834920 8/1978 Fed. Rep. of Germany .
2068189 8/1981 United Kingdom .

OTHER PUBLICATIONS

"Analog Circuit Performance Improves with MOS/CMOS Techniques", Bingham, 8080 Wescon Conference Record, vol. 24, (1980), Sep. 16-18, Anaheim, California USA, pp. 1-14.
"Spannungsspitzen bei MeBzerhackern mit Feldeffekt-Transistoren", article by M. Seifart, KDT, Magdeburg.
Young et al., "Analog NMOS Sampled-Data Recursive Filter", 1977 IEEE International Solid-State Circuits Conference, Feb. 17, 1977, pp. 156, 157.

Primary Examiner—James B. Mullins
Attorney, Agent, or Firm—Alan H. MacPherson; Steven F. Caserza; Richard Franklin

[57] ABSTRACT

An operational amplifier gain stage utilizing switched capacitor resistor equivalent circuits is designed utilizing a delayed clock reference signal ($\phi_D$, $\bar{\phi}_D$) in a unique manner, thereby eliminating the effects of spurious error voltages ($E_S$) generated when utilizing metal oxide silicon field effect transistors as switches (12, 15, 21, 23, 25). The single remaining MOSFET switch (21) which will contribute a spurious voltage component to the output of the operational amplifier gain stage is designed in such a manner as to minimize the spurious voltage generated during operation of the MOSFET switch. A single dummy switch (31) is utilized to further minimize the spurious voltage generated by this single MOSFET switch.

10 Claims, 5 Drawing Figures

SWITCHED CAPACITOR GAIN STAGE WITH OFFSET AND SWITCH FEEDTHROUGH CANCELLATION SCHEME

BACKGROUND OF THE INVENTION

1. Field of the Invention

This invention relates to electronic circuits and more specifically to gain stages utilizing operational amplifiers and switched capacitor circuits as resistor equivalents.

2. Description of the Prior Art

FIG. 1 is a schematic diagram of a prior art gain stage utilizing operational amplifier 30 and a switched capacitor resistor equivalent circuit. Switched capacitor resistor equivalents are described, for example, in "Analog Sample Data Filters", IEEE Journal of Solid-State Circuits, August 1972, p. 302. The use of switched capacitor resistor equivalents is particularly desirable in metal oxide silicon (MOS) integrated circuits, in that resistance values and thus, the ratio of resistors, which determines the gain of an operational amplifier stage, are not highly controllable in MOS integrated circuits. However, capacitance ratios are highly controllable in MOS integrated circuits, due to the fact that capacitor areas are controllable, and dielectric thicknesses are relatively uniform across the surface of the semiconductor die. Thus, capacitance ratios, and therefore the gain of operational amplifier circuits utilizing switched capacitor resistor equivalent circuits, are highly controllable in MOS integrated circuits.

The circuit of FIG. 1 comprises operational amplifier 30 having its non-inverting input 18 connected to ground. A switched capacitor resistor equivalent circuit is comprised of MOS switches 12 and 15, and capacitor 14, having capacitance value $\alpha C$. This switched capacitor resistor equivalent is connected between input terminal 11 and inverting input lead 17 of operational amplifier 30. MOS switch 15 is connected between capacitor 14 and ground, as shown. Capacitor 20, having capacitance C, is connected between inverting input lead 17 and operational amplifier output 19. Connected in parallel with capacitor 20 is MOS switch 21. MOS switches 12 and 21 are controlled by a first clock, labeled $\phi$, which is applied to gate terminal 13 of switch 12, and gate terminal 22 of switch 21. MOS switch 15 is controlled by a second clock, $\overline{\phi}$, which is the inverse of $\phi$. The relationship between $\phi$ and $\overline{\phi}$ is shown in FIG. 2.

During the operation of the prior art gain stage of FIG. 1, the circuit is first initialized by discharging capacitor 20. This is accomplished during the positive half cycle of $\phi$, which causes switch 21 to close, thereby shorting out capacitor 20. At this time, operational amplifier output 19 is connected to inverting input 17 through switch 21. Thus, the inherent offset voltage for operational amplifier 30, $V_{off}$, is present at both output terminal 19 and inverting input lead 17. At the same time, with $\phi$ high, switch 12 is closed, thereby charging capacitor 14 to a voltage equal to $V_{in}-V_{off}$.

When $\phi$ goes low, and $\overline{\phi}$ goes high, switches 12 and 21 open and switch 15 closes. This connects one side of capacitor 14 to ground through switch 15, causing $-(V_{in}-V_{off})$ to be applied to inverting input lead 17 of operational amplifier 30. The charge conservation equation at inverting input lead 17, is shown by Equation (1).

$$\alpha C[V_{in}(NT-T/2)-V_{off}-(-V_{off})]+C[0-(V_{out}(NT)-V_{off})]=0 \quad \text{Equation (1)}$$

where $V_{in}(NT-T/2)$ equals the input voltage at time $NT-T/2$, and $V_{out}(NT)$ equals the output voltage at time $NT$, where $N$ is a positive integer. Manipulating Equation (1) to obtain an expression for $V_{out}$ leads to Equation (2).

$$V_{out}(NT)=\alpha V_{in}(NT-T/2)+V_{off} \quad \text{Equation (2)}$$

As can be seen from Equation (2), the inherent voltage offset, $V_{off}$, appears in the output voltage $V_{out}$. One method of eliminating the effect of $V_{off}$ in the output voltage is shown in FIG. 3. FIG. 3 is essentially identical to FIG. 1, with the addition of switches 23 and 25. During the initialization period, when $\phi$ is high, switches 12, 21 and 25 are closed and switches 15 and 23 are open. One plate of capacitor 20 is connected to inverting input lead 17 and output lead 19 (throughput switch 21), and the second plate of capacitor 20 is connected to ground through switch 25. Thus, rather than completely discharging capacitor 20 during the initialization period, capacitor 20 is charged to $V_{off}$. During the next half clock cycle when $\phi$ goes low and $\overline{\phi}$ goes high, switches 12, 21, and 25 are open, and switches 15 and 23 are closed. Capacitor 20 is thus connected between inverting input lead 17 and output lead 19. This results in the elimination of the offset voltage component of the output voltage, as shown in Equations (3) and (4).

$$\alpha C[V_{in}(NT-T/2)-V_{off}-(-V_{off})]+[C(-V_{off})-(V_{out}(NT)-V_{off})]=0 \quad \text{Equation (3)}$$

$$V_{out}(NT)=\alpha V_{in}(NT-T/2) \quad \text{Equation (4)}$$

The output voltage can be inverted if gate terminal 13 of switch 12 is connected to $\overline{\phi}$ rather than $\phi$, and gate terminal 16 of switch 15 is connected to $\phi$ rather than $\overline{\phi}$. In a similar manner, switch 15 may be connected to a second input voltage rather than ground, thus providing an output voltage proportional to the difference between the first and second input voltages.

In the absence of ideal switches, an error $E_S$ is introduced reflecting capacitive clock coupling between the gate and drain, and the gate and source, of each MOS switch. This error $E_S$ also includes charge injection which occurs when the MOS switch turns off. The mechanism of this spurious voltage $E_S$ is described in detail in copending U.S. patent application Ser. No. 06/185,356, filed Sept. 8, 1980, and assigned to the assignee of this invention, which is hereby incorporated by reference. Thus, the actual output voltage is shown in Equation (5).

$$V_{out}(NT)=\alpha V_{in}(NT-T/2)+E_S \quad \text{Equation (5)}$$

Prior art circuits have been developed which eliminate the inherent offset voltage, $V_{off}$, from the output voltage of an operational amplifier switched capacitor resistor equivalent gain stage. See U.S. patent application Ser. No. 06/185,356, filed Sept. 8, 1980 and U.S. patent application Ser. No. 06/079,339, filed Sept. 27, 1979, both of which are assigned to the assignee of this invention. However, prior art circuits have not been able to eliminate the effect of the error term, $E_S$, caused by parasitic capacitance of MOSFET switches, and charge injection.

SUMMARY OF THE INVENTION

This invention utilizes a time delay between the $\phi$ clock and the $\overline{\phi}$ clock, thus preventing overlap on the leading edge of each clock pulse. This scheme allows all but one MOS switch to be free from the effects of parasitic capacitance and parasitic charge injection. Compensation is then provided for this one remaining switch to minimize the effects of parasitic capacitance and charge injection related to this single switch, thereby minimizing the effects of spurious voltages in the circuit as a whole.

DETAILED DESCRIPTION OF THE INVENTION

Figure 1:
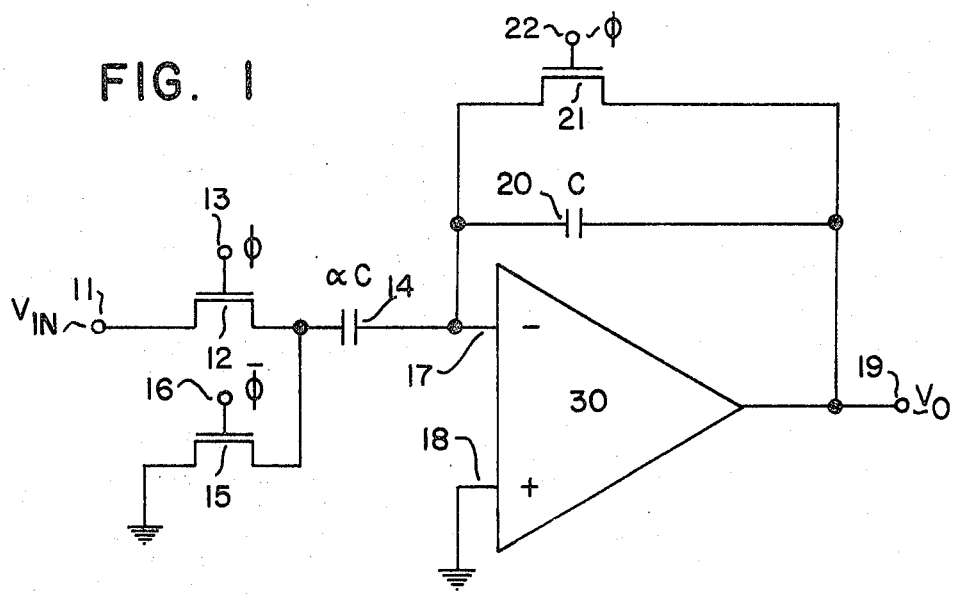
FIG. 1 is a prior art operational amplifier gain stage utilizing switched capacitor resistor equivalents.
Figure 2:
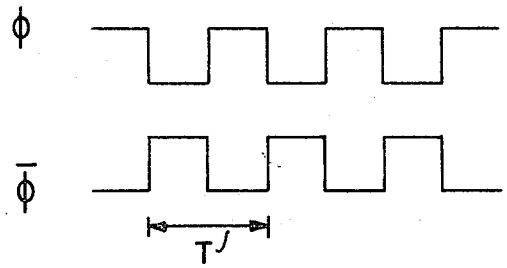
FIG. 2 is a graphical representation of the two clock signals used to control the circuit of FIG. 1.
Figure 3:
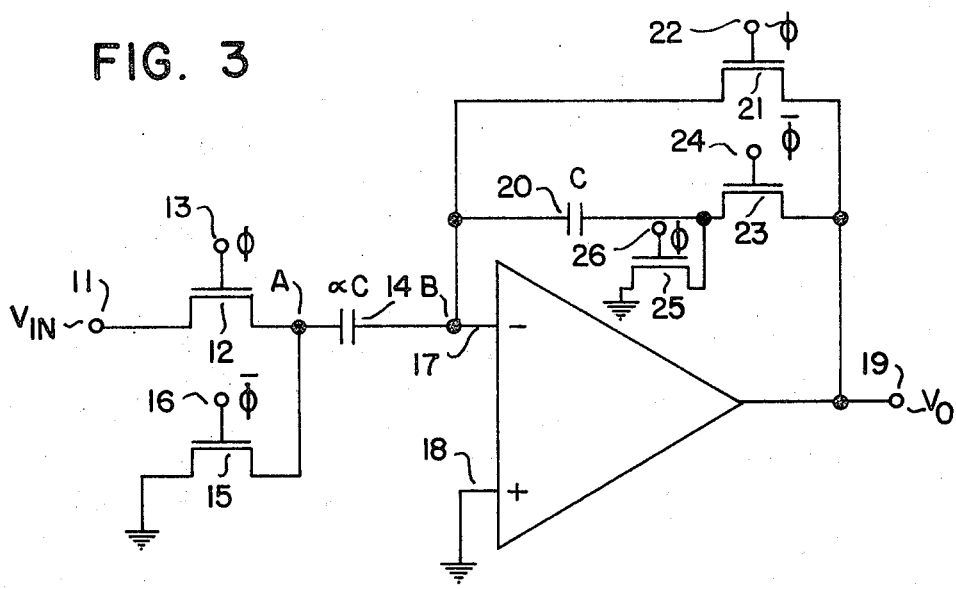
FIG. 3 is another circuit which includes means to eliminate the effects of the operational amplifier offset voltage from the output voltage.
Figure 4:
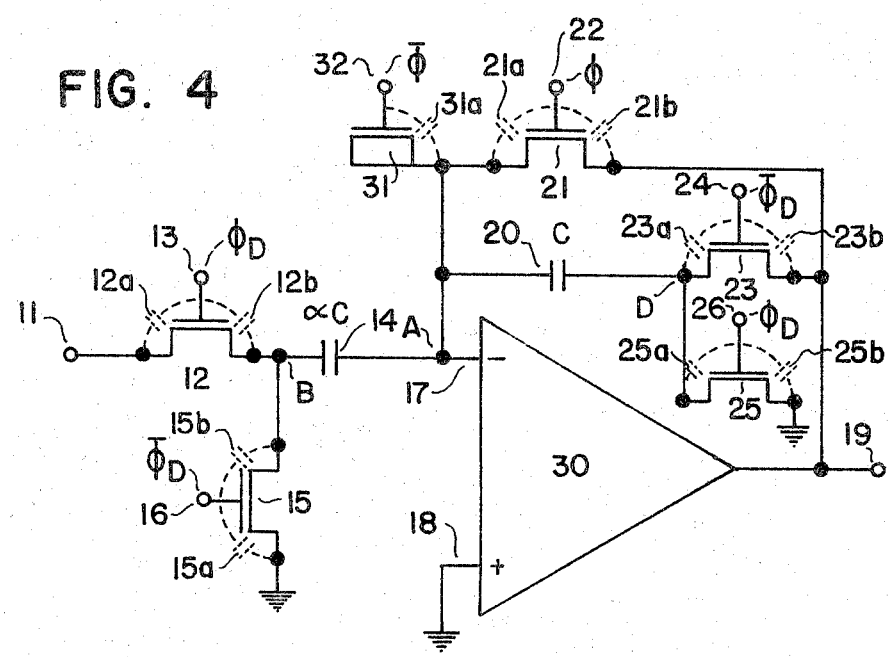
FIG. 4 is a schematic diagram of one embodiment of this invention.
Figure 5:
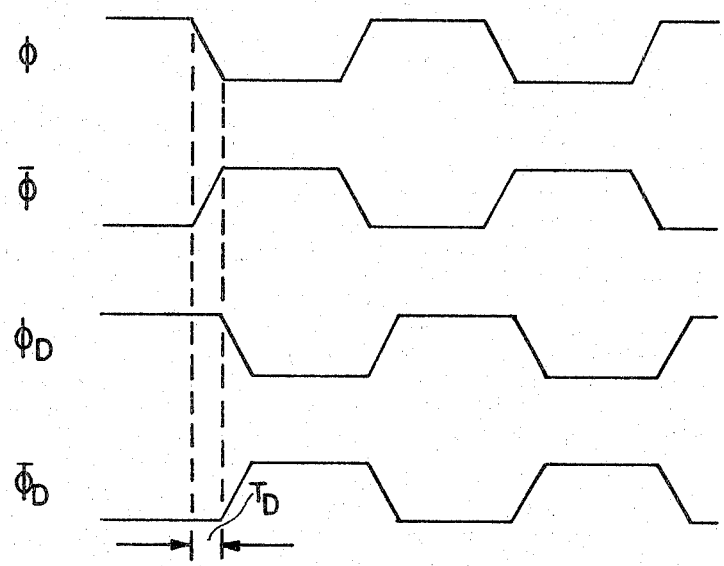
FIG. 5 is a graphical representation of the two clock signals required to operate the circuit of FIG. 4.

A circuit embodying the principals of this invention is shown in the schematic diagram of FIG. 4. Components which operate in the same fashion as those shown in the prior art circuit of FIG. 3 are similarly numbered. Parasitic capacitors are shown with dashed lines in FIG. 4, such as capacitor 15a and 15b associated with MOS switch 15. In contrast with prior art circuits, the clock signals used to operate the circuit of FIG. 4, as shown in FIG. 5, are not simply inverted, but rather also delayed. $\phi_D$ is a clock signal of the same period and duty cycle as clock $\phi$; however, $\phi_D$ is delayed by a time $T_D$, such that the rising and falling edges of $\phi$ do not overlap with the rising and falling edges of $\phi_D$. MOS switch 21 must be completely turned off prior to the switching of MOS switches 12, 15, 23 and 25. In this way, the voltage on output terminal 19 of operational amplifier 30 is dependent only upon the initial input voltage applied to input terminal 11; spurious voltages caused by the operation of switches 12, 15, 23 and 25 have no affect on the output voltage. In practice, $T_D$ is equal to approximately 30–150 nanoseconds, although this delay is dependent on the switching speeds of the switches used.

The operation of the circuit of this invention as shown in FIG. 4 is as follows. During the period when $\phi$ and $\phi_D$ are high, switches 12, 21, and 25 are closed. With switch 21 closed, the output terminal 19 of operational amplifier 30 is connected to inverting input lead 17, thus causing $V_{off}$, the inherent offset voltage of operational amplifier 30, to be present both on output terminal 19 and inverting input lead 17. Capacitor 20 has a capacitance value C; capacitor 14 has a capacitance value $\alpha$C. With one plate of capacitor 20 connected to inverting input lead 17, and the other plate of capacitor 20 connected to ground through switch 25, capacitor 20 is charged to $V_{off}$. $\phi$ then goes low, causing switch 21 to open. A small error voltage, $E_S$ is introduced when switch 21 opens, as previously described. However, the effect of this spurious error voltage may be minimized by proper design of switch 21, and the use of dummy switch 31, whose gate terminal 32 is driven by $\overline{\phi}$, as shown. The use of dummy switches is disclosed in U.S. Pat. No. 3,983,414 issued Sept. 28, 1976 to Stafford et al. The methods of minimizing parasitic error voltage due to MOS switch operation, including the use of dummy switches, is also described in copending U.S. patent application Ser. No. 06/185,356, mentioned previously.

$\phi_D$ then goes low, and $\overline{\phi_D}$ goes high. This causes switches 12 and 25 to open, and switches 15 and 23 to close. Following the closure of switches 15 and 23, any spurious voltage generated by the operation of switches 12 or 15 will have no effect on the gain stage of FIG. 4, as node B is connected to ground (or any other suitable low impedance voltage reference) thus eliminating any spurious error voltage induced on node B by the operation of MOSFET switches 12 and 15. In a similar manner, the operation of MOSFET switches 23 and 25 will have no adverse effect on the output voltage available at terminal 19, in that node D is connected to output terminal 19 of operational amplifier 30, which is also a low impedance point.

While this discussion has disclosed one embodiment of this invention wherein various switches operate simultaneously, (i.e., switches 12, 15, 23 and 25), this invention may be embodied in a circuit where various switches are not operated simultaneously. For example, switch 15 may close after switch 12 opens; switch 23 may close after switch 25 opens. Of importance, however, is the fact that switch 21 must open after each initialization period before switches 12, 15, 23 and 25 change state. By utilizing this time delay, spurious voltages generated by the operation of switches 12, 15, 23 and 25 are prevented from affecting the output voltage on output terminal 19.

Thus, by the use of the unique timing scheme of this invention, an operational amplifier gain stage utilizing switched capacitor resistor equivalent circuits may be formed in such a manner as to eliminate the spurious error voltages generated through the use of MOSFET switches. Circuit complexity and area are reduced by the elimination of all but a single dummy switch used in the prior art to minimize spurious error voltages generated when utilizing MOSFET switches in switched capacitor circuits.

We claim:

1. A gain stage having an input terminal and an output terminal, said gain stage comprising:

an operational amplifier having an inverting input terminal, a non-inverting input terminal connected to a voltage reference, and an output lead connected to said output terminal;

a switched-capacitor resistor equivalent circuit responsive to a first control signal having a first and a second phase, said switched-capacitor resistor equivalent circuit connected between said input terminal of said gain stage and said input inverting terminal of said operational amplifier;

a capacitor having a first and a second plate, said first plate connected to said inverting input terminal of said operational amplifier;

a first switch means responsive to said first control signal, said first switch means connected between said second plate of said second capacitor and said output terminal of said operational amplifier, whereby said first switch means is open during an initialization period;

a second switch means responsive to said first control signal, said second switch means connected between said second plate of said second capacitor and said voltage reference, whereby said second switch means is closed during said initialization period;

a third switch means responsive to a second control signal having a first and a second phase, said third switch means connected between said inverting input terminal of said operational amplifier and said output terminal of said operational amplifier, whereby said third switch means is closed during said initialization period;

wherein said first control signal is identical to said second control signal and delayed from said second control signal, thereby to provide two non-overlapping control signals and to provide an output voltage on said output terminal of said operational amplifier, said output voltage being free from error components caused by spurious voltages generated by the operation of said first switch means, said second switch means and said switched-capacitor resistor equivalent circuit.

2. Structure as in claim 1 wherein said delay between said second control signal and said first control signal is within the range of approximately 30 to 150 nanoseconds.

3. Structure as in claim 1 wherein said switch means are metal oxide silicon field effect transistors.

4. Structure as in claim 3 further comprising a dummy switch means responsive to said second control signal, said dummy switch means connected to said inverting input terminal of said operational amplifier.

5. Structure as in claim 1 wherein said switched capacitor resistor equivalent circuit comprises:
a second capacitor having a first and a second plate;
a fourth switch means responsive to said first control signal, said fourth switch means connected between said input terminal of said gain stage and said second plate of said second capacitor; and
a fifth switch means responsive to said first control signal, said fifth switch means connected between said second plate of said second capacitor and said voltage reference, wherein said fourth switch means is open when said fifth switch means is closed, and said fourth switch means is closed when said fifth switch means is open.

6. Structure as in claim 1 wherein said voltage reference is ground.

7. The method of eliminating the effect on the output voltage of the inherent offset voltage of an operational amplifier having an inverting input lead, a non-inverting input lead, and an output lead, and minimizing the effect of spurious voltages generated by the switching of metal oxide silicon field effect transistors in a switched capacitor gain stage, comprising the steps of:

(a) connecting said non-inverting input lead of said operational amplifier to a reference voltage;

(b) connecting the output terminal of said operational amplifier to said inverting input terminal of said operational amplifier, thereby stabilizing said operational amplifier by causing said output terminal and said inverting input terminal of said operational amplifier to be at a voltage equal to the inherent offset voltage of said operational amplifier;

(c) connecting a first plate of a first capacitor having a first and a second plate to a first input voltage, said second plate of said first capacitor being connected to said inverting input terminal of said operational amplifier, thereby charging said first capacitor to a voltage equal to said first input voltage minus the sum of said reference voltage plus said inherent offset voltage;

(d) connecting said reference voltage to a first plate of a second capacitor having a first and a second plate, said second plate of said second capacitor being connected to said inverting input terminal of said operational amplifier, thereby charging said second capacitor to a voltage equal to said reference voltage minus said inherent offset voltage;

(e) disconnecting said first plate of said first capacitor from said first input voltage;

(f) disconnecting said first plate of said second capacitor from said reference voltage;

(g) connecting said first plate of said first capacitor to a second input voltage;

(h) connecting said first plate of said second capacitor to said output terminal of said operational amplifier; and (i) after completing steps (g) and (h), disconnecting said inverting input lead of said operational amplifier from said output lead of said operational amplifier.

8. Method as in claim 7 wherein step (i) occurs approximately 30 to 150 nanoseconds after the occurrence of steps (g) and (h).

9. Method as in claim 7 wherein said output voltage is defined by the following equation:

$$V_{out} = \alpha [V_{in1} - V_{in2}],$$

where
$\alpha$ = the voltage gain of said gain stage, said voltage gain being equal to the ratio of the capacitance value of said first capacitor to the capacitance value of said second capacitor;
$V_{out}$ = said output voltage appearing in said output terminal;
$V_{in1}$ = said first input voltage;
$V_{in2}$ = said second input voltage.

10. Method as in claim 7 wherein said second input voltage is said reference voltage.

* * * * *